(12) United States Patent
Hammerschmidt

(10) Patent No.: US 9,688,221 B2
(45) Date of Patent: Jun. 27, 2017

(54) CURRENT LOOP SENSOR INTERFACE USING A TERMINATED SYMMETRICAL PHYSICAL LAYER

(71) Applicant: Infineon Technologies AG, Neubiberg (DE)

(72) Inventor: Dirk Hammerschmidt, Villach (DE)

(73) Assignee: Infineon Technologies AG, Neubiberg (DE)

( * ) Notice: Subject to any disclaimer, the term of this patent is extended or adjusted under 35 U.S.C. 154(b) by 106 days.

(21) Appl. No.: 14/828,903

(22) Filed: Aug. 18, 2015

(65) Prior Publication Data
US 2017/0050588 A1    Feb. 23, 2017

(51) Int. Cl.
| | |
|---|---|
| H03K 5/00 | (2006.01) |
| B60R 16/023 | (2006.01) |
| H03H 7/38 | (2006.01) |
| G07C 5/02 | (2006.01) |
| G07C 5/08 | (2006.01) |

(52) U.S. Cl.
CPC ............... *B60R 16/023* (2013.01); *G07C 5/02* (2013.01); *G07C 5/08* (2013.01); *H03H 7/38* (2013.01)

(58) Field of Classification Search
CPC .................................................. B60R 16/023
See application file for complete search history.

(56) References Cited

U.S. PATENT DOCUMENTS 6,130,795 A * 10/2000 Freitas ............... G11B 19/04
360/46

* cited by examiner

*Primary Examiner* — Daniel Puentes
(74) *Attorney, Agent, or Firm* — Eschweiler & Potashnik, LLC

(57) ABSTRACT

A sensor system or a sensor bus comprises a plurality of sensors coupled together by a bus to a controller for sensing physical parameters and responding to changes of the physical parameters. The bus comprises a two wire bus, with a first wire and a second wire, configured to communicate supply signals to the plurality of sensors and data communication signals generated by current modulate signals from the plurality of sensors or the controller. The plurality of sensors and the controller comprise variable current sources. The variable current sources of the sensors generate data communication signals in a first frequency range, while the variable currents sources of the controller and sensors regulate the supply signals from the bus in a different frequency range. A termination network having termination, dividers at both ends of the bus, match the load impedances and the line impedances of the bus within the first frequency range, which is about five to ten times larger than the second frequency range.

28 Claims, 6 Drawing Sheets

CURRENT LOOP SENSOR INTERFACE USING A TERMINATED SYMMETRICAL PHYSICAL LAYER

FIELD

The present disclosure is in the field of sensors, and more specifically, to a sensor interface using a terminated symmetrical physical layer.

BACKGROUND

Modern vehicles include a vast array of sensors, such as air bag sensors, tire pressure sensors, engine sensors, seat belt sensors, and many others. The sensors provide data about the vehicle's operation (e.g., wheel speed, deceleration, etc.) to controller or processor such as an automotive control unit (ACU), an engine control unit (ECU), or other control unit. Based on the sensor communication data received from the sensors on a bus (e.g., a twisted pair or other wired bus), the control unit can determine if an action should be taken (e.g., an airbag deployment, or any vehicle system action).

A peripheral sensor interface 5 (PSI5) protocol and a distributed system interface 3 (DSI3) protocol are example standards defining automotive communication buses. An ECU connected to a communication bus behaves as a voltage supply, for example, and thus, does not necessarily operate as an ohmic voltage source over the bus to the sensors. A network of sensors connected to the ECU through the communication bus can be configured with one or more protection components to prevent device destruction or instabilities. For example, the sensors of the network can have a series of resistors that have a blocking element or feature, which can be inefficient due to certain behavior dependencies. The behavior of the network on the communication bus can be unpredictable due to a relatively low or high ohmic termination on the sensor side of the bus relative to the line impedance, and a low ohmic termination on the ECU side according to ECU specifications providing for it to operate as a low ohmic supply.

Unpredictable signal behaviors of the network can further be problematic as the line or bus length changes from about a half a meter to twelve meters, for example. Different reflection behaviors can occur on the line with an unspecified termination. A typical terminated bus such as a controller area network (CAN) bus utilizes two wires as well, but does not provide the ability to supply the connected bus participants. The CAN communication wires are terminated and used for the data communication. Another two wires would also be required if the bus nodes do not have their own power supply, as is the case for sensors. These two wires can not be terminated, since they have to be driven low ohmic to supply the connected electronic components. The four wires originate from one section or end of the bus, and thus, connecting every sensor with all four of the extended CAN wires is expensive and increases the probability of problems with the more complex connectors.

Another problem is that data rates for some automotive applications (e.g., electrified or hybrid motor drives, or the control of an electronic operated automated transmission gear box), the transmission requires higher data rates than those transmitted over the standard PSI5 or other bus protocols being implemented. The reason for this is that the exchange of messages at low data rate of established sensor busses introduces latency time into the control loop which is extremely critical for the stability of the feedback loop.

These problems call for an improved bus system that allows for transmitting data rates in a range that is similar to a CAN bus, but uses two wires to communicate and simultaneously supply the sensors with energy that is delivered from the ECU side.

DETAILED DESCRIPTION

Figure 1:
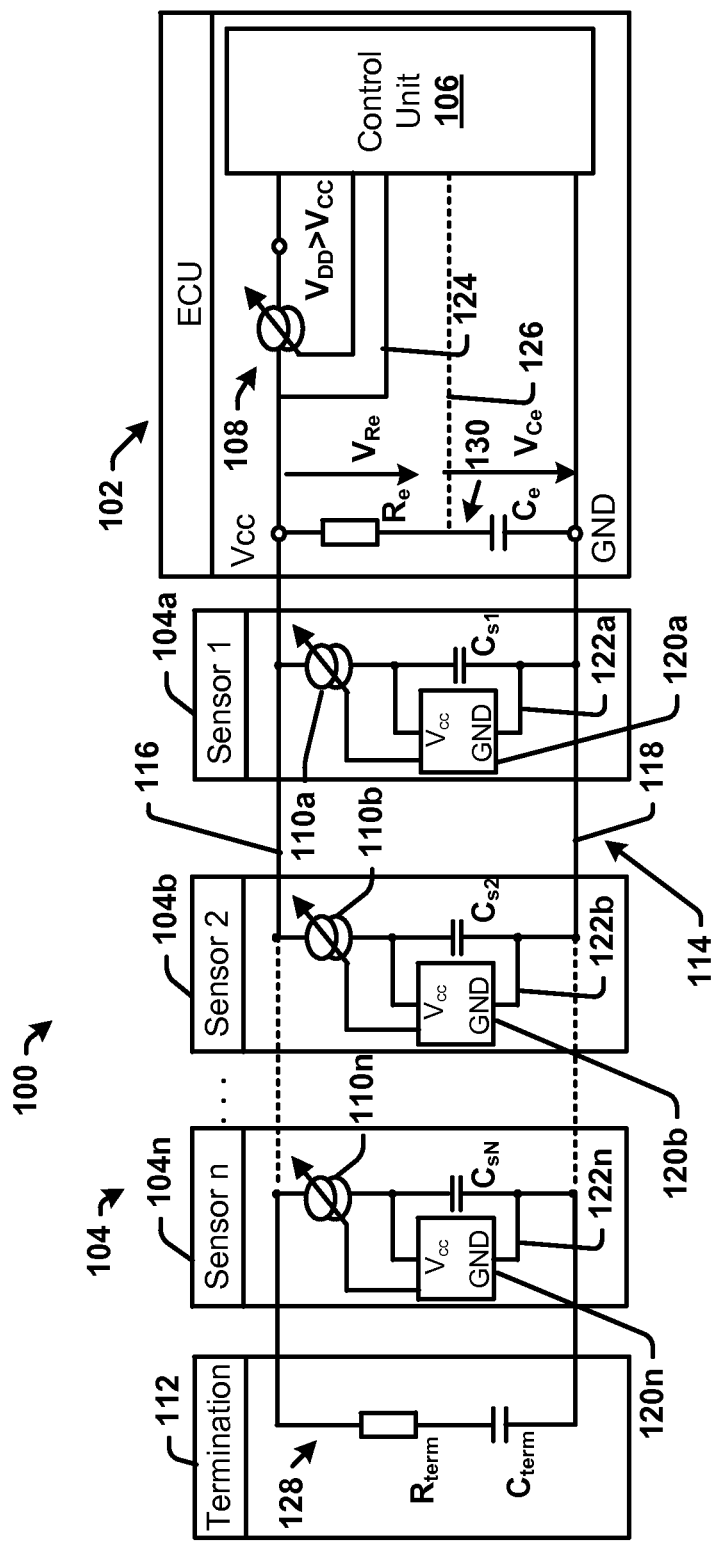
FIG. 1 is a block diagram of a sensor communication system in accordance with various embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an electronic circuit, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors or controllers. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies, a sensor bus communication system (e.g., a vehicle sensor system) and corresponding operations overcome unpredictable and unwanted signal behaviors (e.g., line resonance effects, voltage drops, or the like) on a communication bus connecting a sensor network and a control unit (e.g., an engine control unit, or other controller). The sensor bus communication system can dynamically terminate different reflection behaviors and dynamically adapt the bus line voltage drops regardless of the length of the bus line between each sensor and the controller or a total length of the bus. The bus can be a two wire communication bus, for example, having less wired lines than typical four wire lines of a CAN bus with added supply lines, and also be configured with termination capabilities that enable an increase in data rates over standard PSI5 or DSI3 data rates. This increase in the data rate further enables improved channel encoding schemes (e.g., CRC length, pattern generation, or the like) in the signal modulations for generating data communications between the sensors and the control unit, and thus enable more security and integrity with a reduced probability of undetected bit errors.

Although implementing resistors along the bus line can be used to improve the line termination if the resistors are selected to be within the range of the line impedance (e.g., about 120 ohms), this also can create voltage drops reducing the supply voltage available to the sensors. These problems coupled with issues surrounding line adaptions can be further exacerbated in architectures using only two wires in a communication bus.

Various embodiments overcome these problems by addressing line adaptations and tolerable supply voltage drops together. For example, the two wire communication bus operates to terminate the two bus lines with a termination network that matches impedances on either side, or both sides of the bus (the ECU side or the sensor network side) within a particular frequency range related to line resonance effects between the sensors of the network and the ECU.

In other embodiments, the generation (or modulation) of the data communication signals (e.g., sensor data or control data) operate within approximately the same particular frequency range as the impedance matching by the termination network. This enables an improvement of the data rates of data signals through the communication bus between the sensors and the control unit, which further enables improvements to the channel encoding of data between the sensors and the control unit.

In one example, the sensors comprise current sources that modulate current signals to generate and provide sensor data signals to the control unit in a high frequency range (a first frequency range). These current sources additionally operate as current sinks and as voltage regulators to selectively vary a supply signal (e.g., current or voltage) that is being provided to the sensors in a second frequency range that is lower than the first frequency range for data generation and impedance termination. For example, the regulation operations are performed in a second frequency range that is lower than the first frequency range of the termination network and the current signal modulation for data communication by approximately a five to ten times. This difference ensures an adequate separation between the two frequency ranges for supply signal regulation and data modulation at the sensors. Additional details and embodiments of the disclosure are further described below with reference to the figures.

Referring initially to FIG. 1, illustrated is a sensor bus system 100 that includes an electronic control unit (ECU) 102 coupled to a sensor network 104. The ECU 102 is connected to one side (an ECU side) of a communication bus 114 that is further connected to a sensor network 104 connected to the other side (a sensor side) of the communication bus 114. The ECU 102 can comprise one or more processors such as the control unit 106 on a same die or substrate, or on a separate substrate from other components of the ECU 102. The control unit 106 is connected to a plurality of sensors (e.g., sensors 104a, . . . , 104n) and a termination network 112 via the communication bus 114.

The control unit 106 can transmit supply signals through the bus 114 to the sensor network 104 for powering the sensors 104a, . . . , 104n. To transmit information to the sensors 104a, . . . , 104n, the control unit 106 modulates a supply voltage (e.g., a change in the DC supply voltage) to transmit information to one or more of the sensors (e.g., DC). When data is not transmitted, the control unit 106 can provide un-modulated supply signals (e.g., a DC supply voltage) to the sensors 104a, . . . , 104n. These supply signals can be regulated by the control unit 106 within a low frequency range, for example, compared to the modulated communication signals that are generated as control data or as sensor data by the sensor network 104 in a different higher frequency range than the first frequency range.

The control unit 106 can receive and demodulate sensor data (communication) signals that are modulated by the sensors 104a, . . . , 104n in a first frequency range that is higher than the frequency range related to the supply signals (e.g., a second different frequency range that is five to ten times lower, or below about 1 MHz or less than the first frequency range). In other words, the first frequency range comprises corner frequencies of about 1 MHz or greater, for example, and the second frequency range comprises different corner frequencies that are at least about 5 to 10 times lower than the corner frequencies of the first frequency range. The control unit 104 can then process the data signals based on the pattern of the channel encoding for data transmissions via the bus 114 and, in response to the demodulated data, implement further actions or operations (e.g., a vehicle air bag release or other system function).

The sensors 104a, . . . , 104n can regulate the supply signals being received from the communication bus 114 in the lower (second) frequency range in order to eliminate/ reduce fluctuations in current consumption on the bus 114, while also operate to concurrently modulate data such as modulated signals for data communication along the bus 114 in a higher (first) frequency range. For example, the sensors 104a, . . . , 104n can each comprise current sources 110a, . . . , 110n, which operate to generate current modulated signals for communicating sensor data in the higher frequency range and concurrently regulate supply signals in the lower frequency range. The current sources 110a, . . . , 110n operate as current sinks to receive supply signals, and operate as voltage regulators to stabilize fluctuations occurring in the received supply signals.

These two functionalities (regulation and modulation) by the current sources 110a, . . . , 110n of the sensors are clearly separated in their respective frequency ranges. The control of the supply regulation is much lower than the pattern generation (data modulation) because if the control is faster it would change the impedance of the network and make it lower ohmic, or, in other words, generate a mismatch again between the bus sides. The sensors 104a, . . . , 104n connected to the bus 114 between the termination 130 on the ECU side and the final termination 128 can comprise an impedance that is in the frequency range of the communication signal (first, high frequency range), which can be at least a factor of five to ten higher than the line impedance (e.g., in a range of 120 ohms for a twisted pair line). Therefore, the sensor should have at least an impedance of about 1 kilo-ohm or 10 kilo-ohm in the first, higher frequency range. The more sensors that can or are connected to the bus, the higher the factor between the line impedance and the sensor impedance in the first frequency range. If this condition factor is fulfilled, multiple sensors from one sensor to five or more connected together on the bus 114 will not significantly impact the overall bus impedance and the termination conditions on either side of the line during operation.

The sensor network 104 can comprise up to n sensors in number, which are connected to the two wire communication bus 114. The load impedance of each sensor of the plurality of sensors can further be N times greater than the line impedance, wherein N is greater than one and N/n is smaller than 1. For example, if N is two and n=4 sensors, then N/n=½, in which N and n can be designed to be geometrically symmetrical or proportional to one.

The current sources 110a, . . . , 110n are coupled to a sensor module 120a, . . . , 120n, which can comprise components (not shown) such as, but not limited to, a supply voltage connection Vcc, a ground connection for powering various sensor components (now shown), at least one sensor element for detecting a physical parameter, a controller, one or more voltage regulators, an oscillator, or other sensor components such as other sensor elements in addition to a main sensor element, for example. In one embodiment, the current sources 110a, . . . , 110n can regulate a voltage (e.g., a supply voltage) detected across a buffer capacitor Cs1, . . . , Csn within a feedback (control) loop 122a, . . . , 122n, and thus stabilize the voltage from any fluctuations occurring by the sensor 104a, . . . , 104n, which could result from operations of the sensor (e.g., different modes, clocked operations, measurements, etc.).

Each sensor module 120a, . . . , 120n can monitor a voltage across the capacitors Cs1, . . . , Csn, which is a blocking or buffer capacitor Cs1, . . . , Csn that can also shield the sensors 104a, . . . , 104n from high frequency behaviors. Based on changes in the supply voltage detected across the capacitors Cs1, . . . , Csn, the sensor modules 120a, . . . , 120n control the current provided by current sources 110a, . . . , 110n to then regulate the voltage supply across the capacitors Cs1, . . . , Csn and stabilize any fluctuations in a second frequency range below the communication signal spectrum (first frequency range).

The current being provided by the current sources 110a, . . . , 110n is adaptable or variable based on the control of the feedback loops 122a, . . . , 122n with the capacitors Cs1, . . . , Csn. As the current consumption of each sensor 104a, . . . , 104n increases, the voltage regulation of the sensor modules 120a, . . . , 120n increases the current drawn by the feedback loop 122a, . . . , 122n and stabilizes the supply voltage of each sensor 104a, . . . , 104n. Because the regulation operations are slow acting, the sensors 104a, . . . , 104n do not react to changes in the same frequency range as for data modulation. As such the feedback loops 122a, . . . , 122n of the sensors 104a, . . . , 104n are limited to operating within lower frequencies than the data modulation operations or the matching processes by the termination network 112, which are further detailed below.

On the ECU side of the bus 114, the ECU 102 operates with the current source 108 to deliver an average current for all sensors, operating as a low frequency regulated current source instead of a current sink. The control unit 106 utilizes the current source 108 to regulate a supply voltage detected on the bus 114 at the node Vcc. The control unit 106 monitors the bus line with a control loop 124, and regulates voltage changes based on changed detected in the control loop 124 from the Vcc node or across the resistor Re. The control unit 106 can selectively vary the current source 108 to accommodate for fluctuations present on the line and stabilizes the supply on the bus 114 based on a predetermined reference value (e.g., 5 V, 3.3. V, or other value).

A line 126 can optionally be provided from the control unit 106 to below the resistor Re to improve a reception based on the high pass filtered signal $V_{Re}$ or access a low pass filtered supply signal $V_{Ce}$ for the regulation of the band limited supply voltage. This dotted line 126 or connection can enable a faster gathering of sensor data and operate as a demodulation sink, for example.

Demodulation of the current modulated message or sensor data can also be performed by the control unit 106 by observing the voltage drops that the drawn current modulation currents cause on the bus voltage Vcc or the voltage $V_{Re}$ across the ECU side termination resistor Re. The time constant of Re*Ce is chosen to be below the frequencies that are for data communication and thus the voltage across Ce can be assumed to remain almost constant during modulations (e.g., current modulation or voltage modulation).

In one embodiment, the sensor bus system 100 operates to keep the behavior of the sensor bus standards (e.g., PSI5 or DSI3) by making the regulated current source 108 on the ECU side for the bus 114 low ohmic (or of low impedance compared to the sensor side of the bus) due to the operation of the voltage regulation loop 124, and further keep the impedances of the current sources 110a, . . . , 110n connected to the bus on the sensor side high ohmic within the DC range (frequency second range) below the first frequency range being used for the data communications.

In addition, the sensor bus system 100 further operates to change the behavior of the sensor bus standards (e.g., PSI5 or DSI3) by making the impedance of the regulated current sources 110a to 110n, or 108 on any of the sensors 104a, . . . , 104n as well as on the ECU side of the bus 114 high compared to the impedance of the termination networks/devices 128 and 130 on either side of the bus 114 for the first frequency range used for the communication signals. Due to the high impedance of the controlled current sources in the first frequency range of the communication signals, the line termination in this frequency range can be controlled by the termination network 112 with termination device 128 and 130.

The termination network 112 comprises termination device 128 comprising a resistor Rterm and a capacitor Cterm in series on the sensor side of the bus 114. The termination network 112 can also include an ECU terminal device 130 comprising the resistor $V_{Re}$ and capacitor Ce being coupled on the ECU side of the bus 114. The termination network 112 with the terminal 128 is configured to have high impedance at low frequency due to the serial capacitor 114. For example, the high impedance of the termination network 112 can be approximately five times or more the impedance of the bus 114 within ranges used for the data communications (e.g., about 1 MHz or greater). For example, the impedance within the frequency range that is used for the communication (the first frequency range) is matched to the line impedance of the used communication cable or bus 114, e.g. 120 ohms for a twisted pair of wires. The matching in the communication frequency range is achieved by choosing the resistors Re and Rterm in the termination devices appropriately and dimensioning the corresponding capacitors Ce and Cterm in a way that the time constant of the RC element is safe below the reciprocal of the lower corner frequency of the communication signal spectrum.

In another embodiment, the bus 114 comprises a first wire 116, as a high side of the bus 114, and a second wire 118, as a low side of the bus 114, in which the first and second wires 116, 118 are used to supply the sensors and transmit data. The bus 114 is therefore a two wire bus with termination network 112 having the termination resistor Rterm matched to the line impedance (e.g., about 120 ohms) for a twisted pair. The overall impedance is approximately neutral to the resistance of the bus 114, which means it is a termination with a frequency range that stops resonances due to reflections on the bus lines (e.g. a twisted pair). The frequency range relevant for impedance matching is significantly higher than the frequency used to supply the sensors 110a to 110n, in which the matching impedance can be about five times or more the line impedance. The capacitor Cterm coupling of the termination device 128 is terminated so the frequency range can be modified or decreased with a capacitance. The termination network provides a matching accuracy that is within an accuracy range of 0.5 to 2 times the line impedance within the same frequency (first frequency range) as for data communication.

In one advantage, the transients caused by the generation of data communication on the bus 114 are no longer reflected, either on the sensor side or on the ECU side. Thus, fluctuations become absent on the bus line 114 that would normally had heavily distort communication signals. This enables an increase in data rates for data communication signal by a factor of about ten times over the PSI5 standard or the DSCI5 standard.

Figure 2:
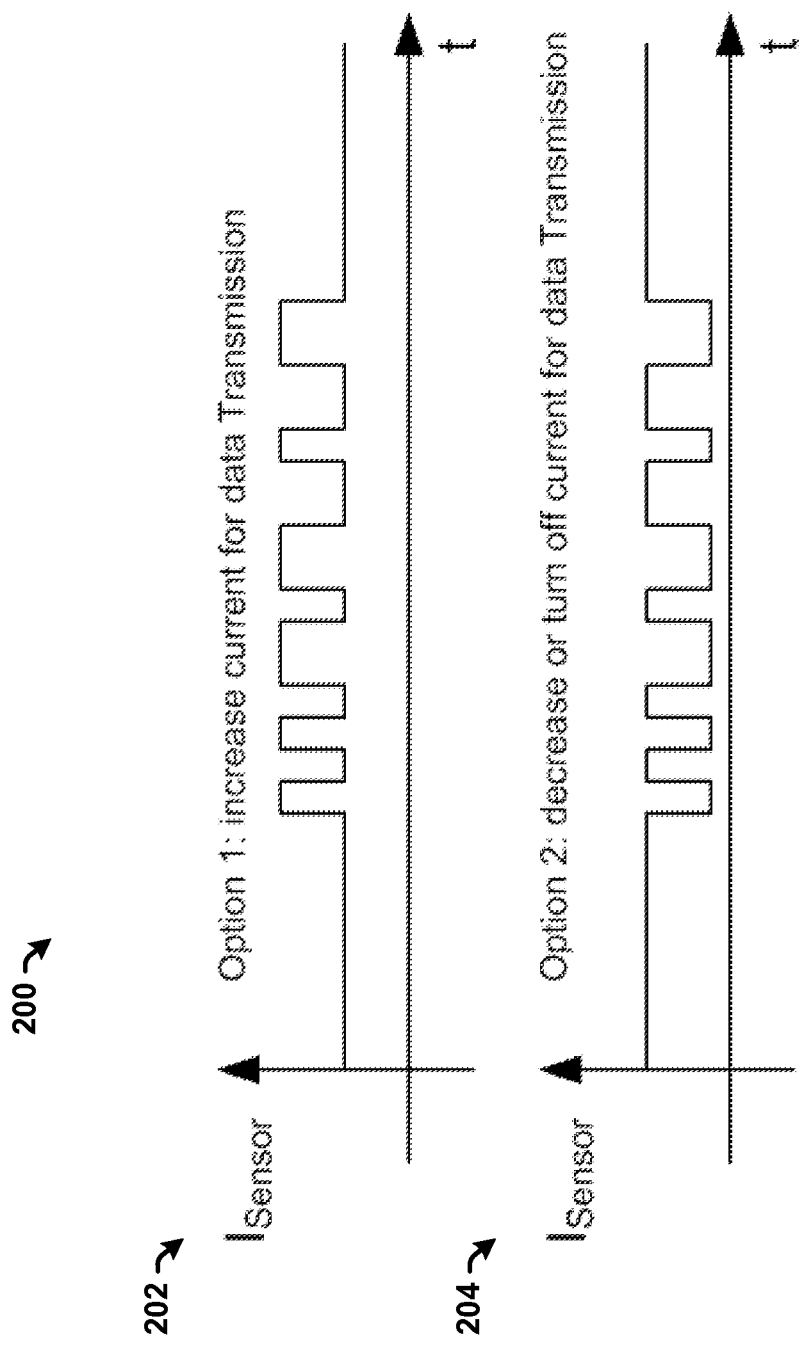
FIG. 2 is an example of different communication patterns for a sensor communication system in accordance with various embodiments.

Referring to FIG. 2, illustrated are examples of modulation schemes 200 in accordance with various embodiments. The current sources 110a, . . . , 110n, for example, can operate in the first frequency range of about 1 MHz or greater, which is several times larger in frequency than the second frequency domain for supply regulation, in order to modulate current signals as a current switch for sensor data. Likewise, the current source 108 of the ECU 102 can also be used to generate protocol data and communicate with sensors within the first frequency via current modulation signals.

A first modulation scheme 202 can be utilized for pattern generation and transmitting communication data by increases in the sensor current at each sensor 104a, . . . , 104n. The current sources 110a, . . . , 110n can modulate the current signals by increasing currents based on changes in a detected physical parameter (e.g., magnetism, pressure, or other physical property). The plurality of current sources 110a, . . . , 110n, respectively corresponding to the plurality of sensors 104a, . . . , 104n, is configured to generate a pattern of the data communication signals comprising only rising signal levels based on increases of a modulation current in the first frequency range for data transmissions.

The second modulation scheme 204 enables a decrease in the sensor power consumption. The current sources 110a, . . . , 110n generate sensor data as communication data for transmission by generating patterns based on a decrease of the current at the sensors. Each current source 110a, . . . , 110n can operate and communicate data independently of one another. The current sources 110a, . . . , 110n, respectively corresponding to the plurality of sensors, thus operate to decrease an average power consumption by generating a pattern of the data communication signals comprising only falling signal levels based on decreases of a modulation current in the first frequency range for data transmissions.

Modulation is now symmetrical along the bus line 114 and can be done to both sides of the bus 114, the sensor side) and the ECU side within the communication frequency range so both sides of the bus 114 match the line impedance of the bus 114 and are thus approximately equal. Because the sensors 104a, . . . , 104n behave as current sinks, the capacitors Csa, . . . , Csn can also be discharged during the generation (modulation) or transmission of sensor data without interference of the supply voltage being used for powering the respective sensor.

Figure 3:
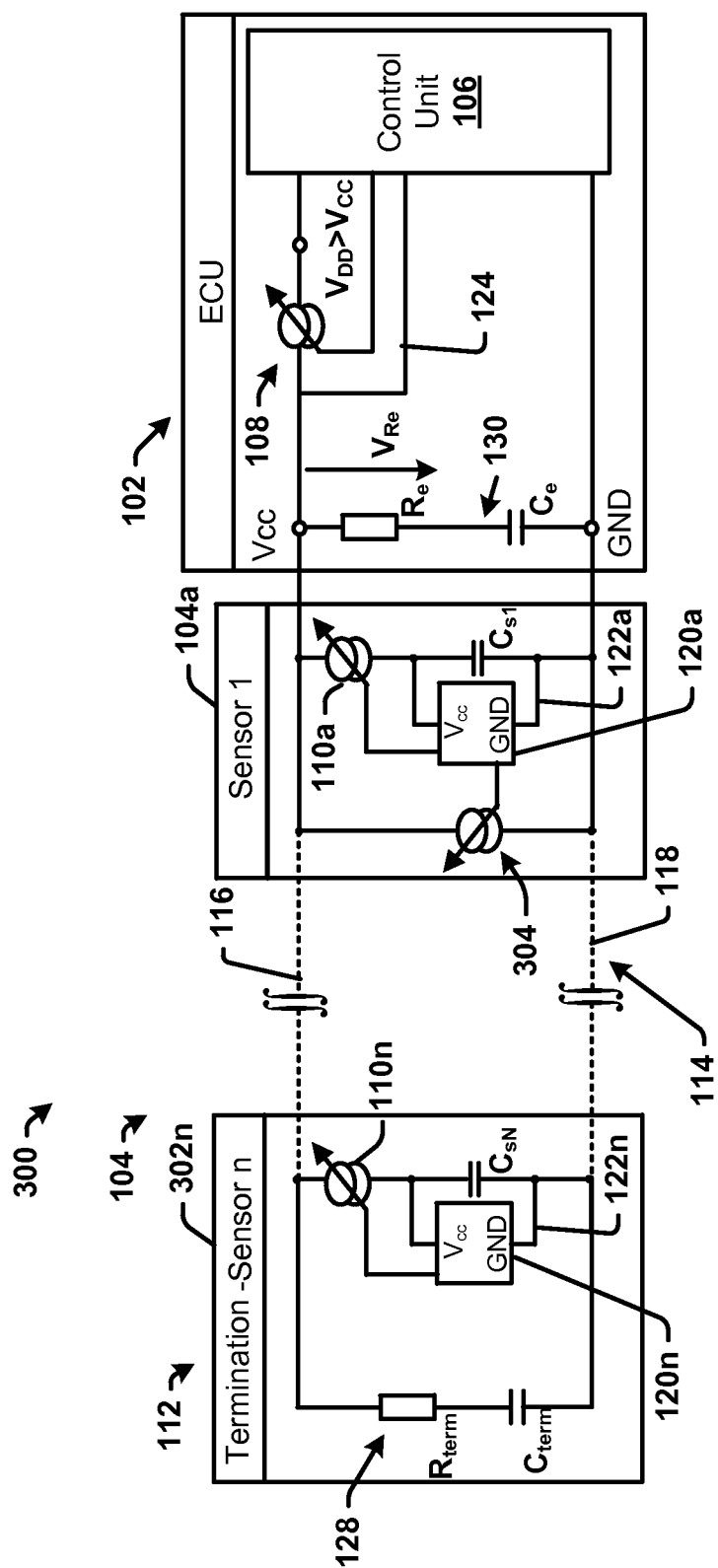
FIG. 3 is another block diagram of a sensor communication system in accordance with various embodiments.

Referring now to FIG. 3, illustrated is another embodiment of a sensor bus communication system 300 that comprises similar aspects as the system 100 of FIG. 1. The system 300 provides the sensor network 104 having one of the sensors 302n among the plurality of sensors 104a, . . . , 302n of the sensor network 104 integrated with the termination device 128, as opposed to being separate from the sensors 104a, . . . , 104n of the sensor network 104 as in FIG. 1. The sensor 304n and the termination device can be implemented, for example, as part of the sensor substrate, on a same circuit board, or die rather than separate from one another. Although the termination device 128 on the sensor side of the bus 114 is combined or integrated with the sensor 302n, any one of the other sensors could have the termination device 128 integrated thereat so that only one of the sensors 104a, . . . , 302n of the sensor network 104 is integrated with the termination device 128. For example, the termination device 128 can be integrated instead with sensor 104a only.

Alternatively in other embodiments, the termination can be distributed over all the sensors 104a, . . . , 302n, in which each sensor can have a line impedance RL and the terminal impedance can be selected as Rterm=RL*n, with n being the number of sensors connected to the bus 114. In one example, the line impedance can be 120 ohms for a twisted pair line, or 50 ohms for a typical coaxial line as the bus 114. In this case now every sensor 104a, . . . , 302 has a part of the termination, which can include multiple sensors on one bus 114 (e.g., between one and four sensors). With one to four sensors, for example, a termination resistor Rterm can be selected that is twice the line resistance. The resistance can be selected to a higher termination impedance of 240 ohms compared to the 120 ohms of the line impedance in the case where only one resistor is connected with one sensor on the bus 114. In the case of two resistors and two sensors on the bus 114, each could be configured in parallel as 240 ohms to achieve the 120 ohms of the line impedance. With three resistors and sensors, each could be configured in parallel as 240 ohms to get a termination of the bus with 80 ohms which is ⅔ of the line impedance and with four resistors then each resistor could be configured in parallel with 240 ohms to get half the bus line impedance of 120 ohms, and so on so that the impedance is similar to the other side where the termination resistance is too small, for example. These impedances are examples and are not limited to any specific values as one of ordinary skill in the art will appreciate.

In another embodiment of FIG. 3, at least one (e.g., sensor 104a) of the sensor network 104 comprises a first current source 110a and a second current source 304. The current sources 110a and 304 are configured to regulate the voltages and modulate currents independently from one another. The voltage at each sensor can be regulated as discussed above with respect to the current sources 110a, . . . , 110n of FIG. 1 by increasing a current at a sensor of the plurality of sensors in response to a decrease in a voltage and decreasing the current in response to an increase in the voltage. The supply voltage regulation, for example, can be performed or controlled by the first current source 110a of the sensor 104a in a slower or lower frequency than current modulation, which can be controlled separately via the second current source 304. Thus the slow supply voltage regulation and the current modulation is separated in the frequency range.

The first current source 110a is a slow regulation current source in order to stabilize the voltage supply of the sensor 104a. The second current source 304 directly creates the modulated currents, which are the currents for the data transmission. For the current modulation, the second current source 304 can modulate a current signal to communicate either to other sensors on the sensor network 104 or to the control unit 106. Both current sources 110a and 304 can be controlled by the sensor module 120a, which can generate separate control signals from a processor for controlling operations related to regulation and modulation.

In one example, measurement data of a physical property, such as a detected change or other data related to a parameter sensed by the sensor can be communicated via current modulated signals from the sensors 104a, . . . , 302n of the sensor network 104. The control unit 106 can detect fluctuations of the current at the node Vcc or across the resistor Re in a voltage $V_{Re}$. Data can also be communicated to other sensors as a select signal, a setting configuration, or other communication. Likewise, the control unit 106 can generate modulation signals as data to the sensors 104a, . . . , 302n, which can demodulate the signals and decode the data from patterns in a voltage detected thereat.

In low frequencies comparable to the second frequency range, the sensor current sources 110a, . . . , 110n, and 304 are high ohmic towards the bus 114 with respect to the ECU current source 108, which is low ohmic in comparison towards the bus 114 resulting from the closed loop control operation with control unit 106. The termination networks are thus high ohmic, which is facilitated by the capacitors Ce and Cterm.

In high frequencies comparable to the first frequency range, the sensor current sources 110a, . . . , 110n, and 304 are still high omic, and the ECU current source 108 is also high ohmic due to the bandwidth of the control loop being safely below the current modulation spectrum. The termination network 112 with termination devices 128 and 130 have a matched impedance defined by Rterm or Re, respectively, since the capacitors are negligible at high frequencies.

Figure 4:
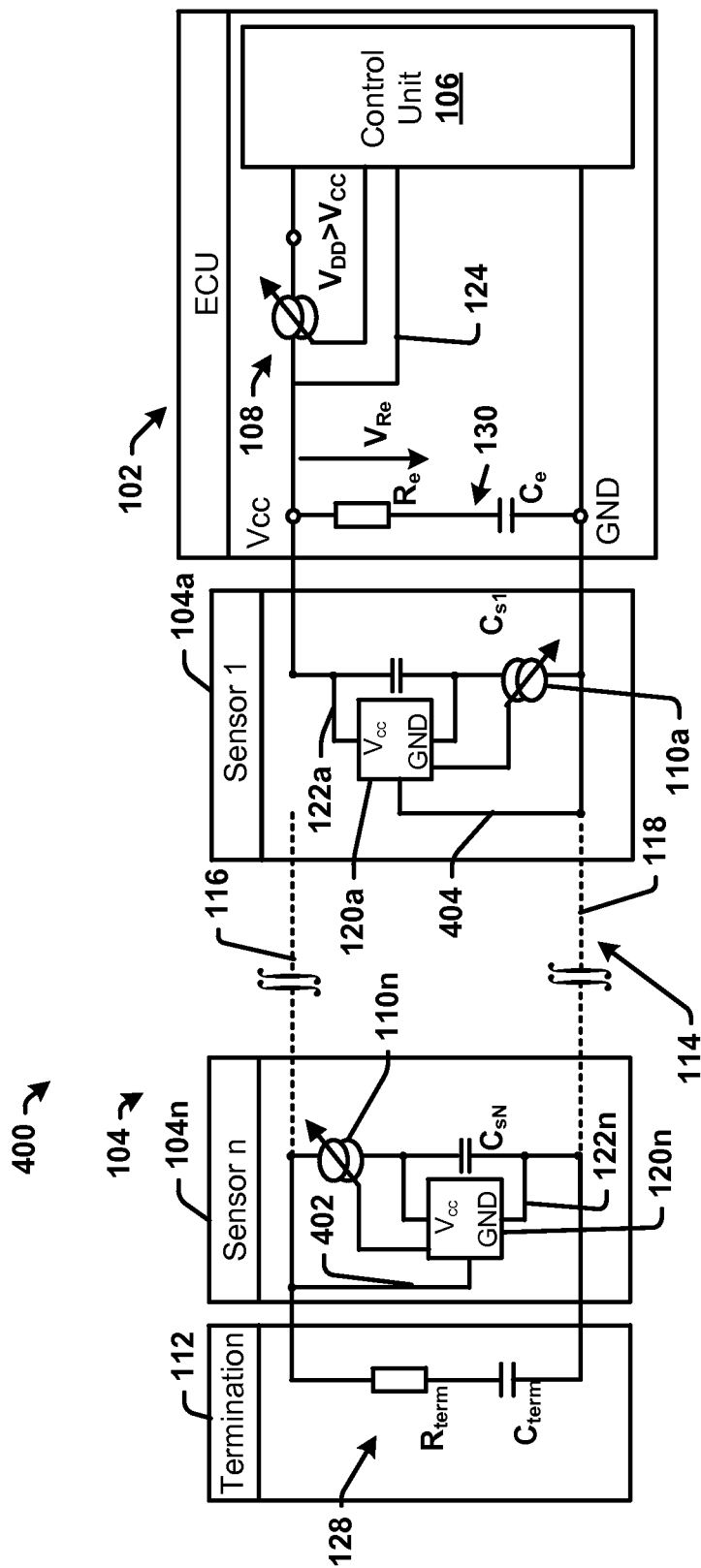
FIG. 4 is another block diagram of a sensor communication system in accordance with various embodiments.

Referring to FIG. 4, illustrated is a sensor bus communication system 400 in accordance with various embodiments. The sensor bus communication system 400 is similar to the systems discussed above and further comprises additional sensor connections 402 and 404, along with an alternative architectural configuration.

The configuration of the system 400 has the termination device 128 separate from the sensors 104a, . . . , 104n, or beyond the bus line 114, which comprises the first wire 116 as a high side of the bus 114 and the second wire 118 as a low side of the bus 114. At least one sensor 104n and at least one sensor 104a are coupled to the bus with an additional wire 402 and 404, respectively. For example, the sensor 104n comprises the connection 402 from the sensor module 120n to the first line 116 (the high side), and the sensor 104a comprises the connection 404 from the sensor module 120a to the second line 115 (the low side).

The sensors 104a, . . . , 104n are individually capable of monitoring the bus 114 in a similar way as the ECU 102, and are thus able to decode messages coming from the control unit 106 or other sensors. This symmetrical communication along the bus 114 offers a large advantage over state-of-the-art implementations of current loop sensor connections like PSI5 or DSI3. The bus 114 operates to achieve or comprise a symmetrical data rate in both directions as bi-directional, or a half duplex two wire bus.

In one embodiment, the sensor 104n, depicted on the far left of the bus line 114, is supplied through the current source 110n as a current sink connected on the high side 116 of the bus 114. The sensor 104a is supplied through the current source 110a as a current sink connected on the low side 118 of the bus 114. Together with the additional connections 402 and 404, respectively, the sensors 104a, . . . , 104n are configured to monitor or measure the supply signals between the terminal 128 and the connection wire 402 or 404 via the sensor modules 120a, . . . , 120n. The measured supply signals are then modulated by the current supplies 110a, . . . , 110n, which are able to measure or monitor the voltages on the bus 114 in a similar way as the ECU 102 or control unit 106.

In another embodiment, the sensors 104a, . . . , 104n are configured to communicate data between or among themselves as well as between the control unit 106. Because the sensors 104a, . . . , 104n can measure the supply signals on the bus 114, in a similar way as the ECU side of the bus 114 with the control unit 106, and a two directional communication is possible. The sensors 104a, . . . , 104n are able to modulate currents in the same frequency range as the communication data range on the bus 114, in which the bus lines 116 and 118 are terminated and are further able to receive such communication signals. The sensors can be connected to one another in the sensor network 104 in a two wire bus and achieve symmetrical, bi-directional data rates that are higher than PSI5, DSI3, or other protocols used for standards for sensors in automotive vehicles.

In one example, the control unit 106 or another sensor can then select another sensor of the sensor network 104 or change a change calibration setting, mode of operation of the sensor or communicate other data. The two directional bus 114 allows transmitting with a high data rate back and forth between the ECU side and the sensor side of the bus 114. Test signals, for example, can also be utilized as the data communication on the bus, so that a test signal is communicated among the sensors, the control unit 106 or a combination thereof, which can be a large advantage for testing demands on the system for functional safety that can be achieved with the bus 114. Other types of communication data can include additional data from one sensor to another or the control unit 106, which can demand that a particular sensor change its set up or some process, or reduce its data rate, for example. No one data type or functional response to data between the sensors themselves, the control unit 106 or a combination is limited herein as one of ordinary skill in the art will appreciate.

In another embodiment, because the current modulator and signal demodulator operations of the sensor 104a or other sensors in the network 104 can be on the low side, the current source 110a can be realized with an N-type metal-oxide-semiconductor (NMOS) transistor, instead of a P-type metal-oxide-semiconductor (PMOS) transistor, as with the current source 110n. This might be an advantage in some cases because now, the current source 110a can comprise the NMOS transistor for operations (e.g. modulation and regulation), which is smaller than a PMOS.

The sensor bus systems with the two wire communication bus 114 comprises a symmetrical termination on both sides of the bus, which facilitates communications from either side of the bus 114 to the other side. In addition, both modulation and regulation operations can be performed with a voltage or current on both sides of the bus 114, as opposed to prior methods where only voltage modulation was performed on the ECU side and current modulation on the sensor side. The line termination network 112 keeps the current modulation from interfering with the supply signals on the bus 114 because reflections at the open (high ohmic) termination on the sensor sides of the bus 114 or the shorted (low ohmic) ECU side of the bus 114.

Figure 5:
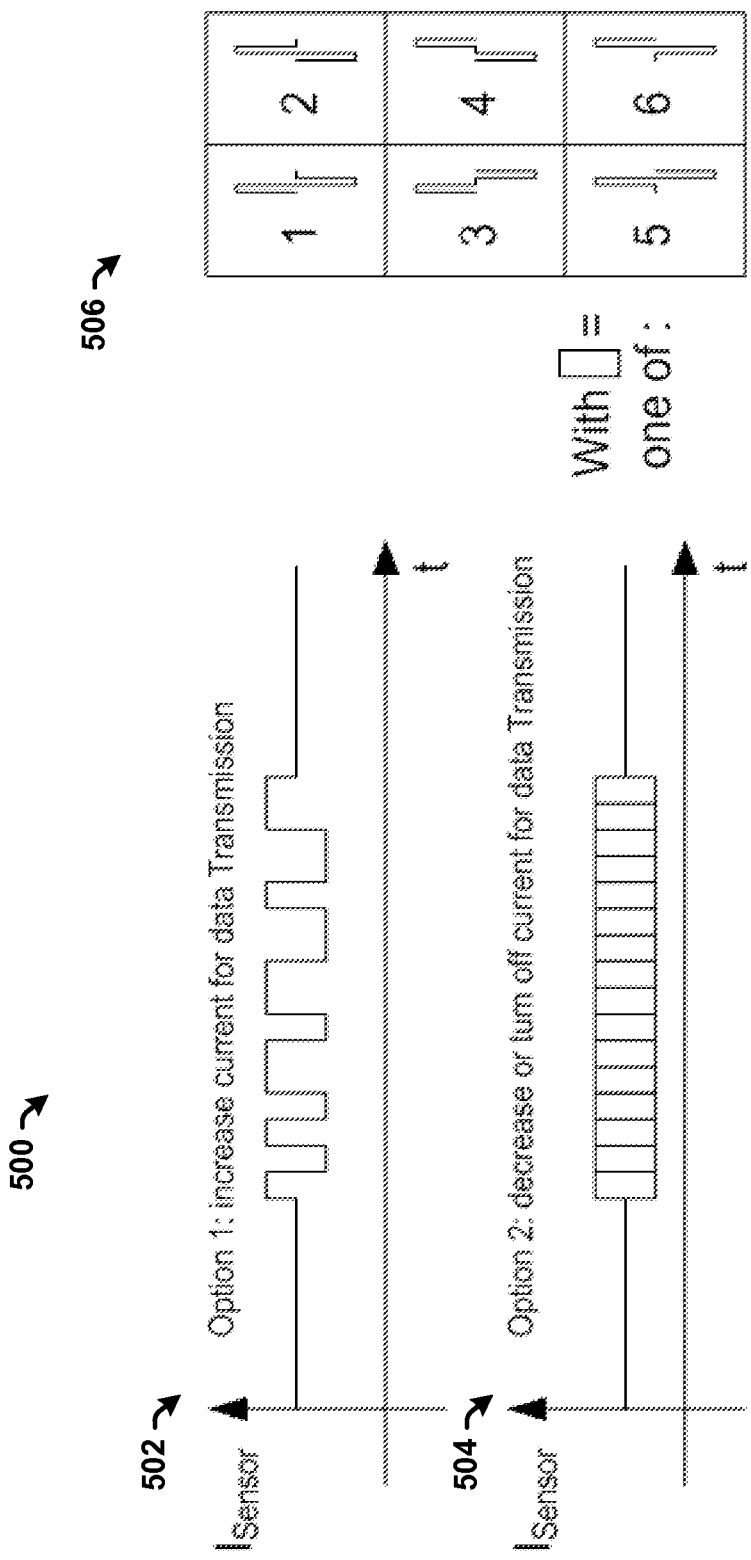
FIG. 5 is an example of different communication patterns for a sensor communication system in accordance with various embodiments.

Referring to FIG. 5, illustrated are example patterns 500 for current modulation of the data signals in accordance with various embodiments. As stated above, the current sources 110a, . . . , 110n corresponding to each sensor varies according to supply (e.g., voltage) regulation operations and data (e.g., current signal) modulation operations. For data modulation, the current sources 110a, . . . , 110n switch between the high and low levels of the patterns that are generated. The sensor functioning is slowed in a frequency range by a factor of five or ten below that of modulation frequencies, and thus the sensors have simple switching in the frequency range for generating the patterns for data communication or channel encoding. The current sources 110a, . . . , 110n can switch to an increase or to a decrease current for pattern generation 502, and thus, for example, can also create a code alphabet between a decrease current, an average current and an increase current in pattern generation 504.

The pattern generation signals (data communication signals) can be somewhere in the frequency range of between about 1 MHz to 10 MHz or higher, for example. The voltage regulation functionality on the sensor and on the ECU side can be below, for example, about 200 kHz, or five to ten times lower than the modulation of data signals (e.g., current modulated signals). The modified signal can comprise an average feed signal, or current signal that can be approximately equal to the idle current of the system, when no changes in normal operation are occurring in the system. The first pattern 502 can be a binary code, in which the modulation is similar to the patterns generated in FIG. 2. The pattern 502 initiates with a half-step up and modulates with a plus, or minus one step, while ending with a half-step down. With a low pass filter on the bus 114, the bus 114 can also be further filtered and the DC level not be changed, which is big advantage since the supply does not need to react on the current modulation that no longer changes the average supply voltage, which provides further headroom for the separation of the two frequency ranges by a guard band being created by lowering the supply regulation bandwidth.

In one example, Manchester codes can be used on the bus between the sensors and the control unit 106. The data communications can also be efficiently filtered out and also not impact the supply signals, and likewise the supply regulation or voltage regulation does not impact the data modulation.

The second pattern 504 steps away from using Manchester codes (as PSI5) and away from non-average free signals (as DSI3), and is an average signal free alphabet for communication that takes advantage of the increases in data rate for improved channel encoding. There are six possible signals 506 that are average free starting with signal one comprising a sequential order having a high peak, a low peak and a serial (flat) line, in which "serial" means a zero amplitude level. Signal two includes a low, a high and a serial. Signal three includes a high, a serial and a low. Signal four has a low, a serial and a high. Signal five has a serial, a high and a low, and signal six is inverted with a serial, low and a high. These various signal options 506 can be codes within each box of the pattern 504 to communicate various different levels or types of data or commands along the bus 114, such as by current modulation in the first, high frequency range. An advantage of the signal pattern 504 is that it provides an additional advantage in the data rate because three pulses can be transmit in six different states, unlike the Manchester codes in the first pattern 502, and now 2.5 Bits can be transmitted with 3 pulses rather than 1 Bit with 2 pulses, and enable a better utilization of the bus bandwidth of bus 114. However this is just one example and more complex code alphabets can further improve the advantage and make it easier to match a binary word to the code alphabet by selecting $2^n$ valid symbols as a result of increased data rates enabling improved channel encoding.

While the disclosed methods are illustrated and described below as a series of acts or events, it will be appreciated that the illustrated order of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
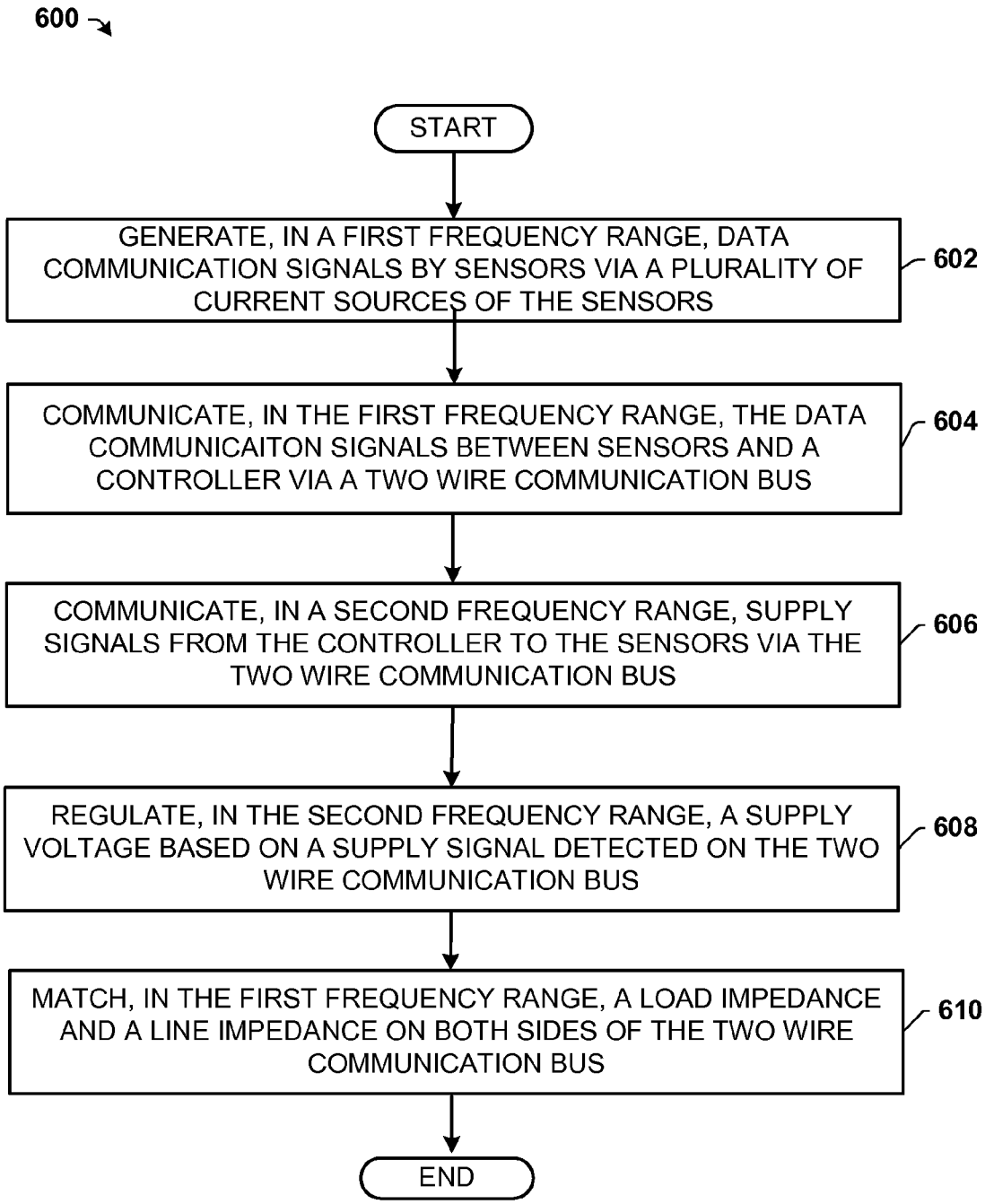
FIG. 6 illustrates a method of operating a sensor communication system in accordance with various embodiments.

Referring to FIG. 6, illustrated is a method 600 for sensor bus communications, in which an increase in data rate can be facilitated. The method 600 initiates, and at 602 comprises generating, in a first frequency range, a plurality of data communication signals by a plurality of sensors via a plurality of current sources of the sensors.

At 604, the method further comprises communicating, in the first frequency range, the plurality of data signals between the plurality of sensors and a controller via a two wire communication bus comprising a first wire and a second wire connecting the plurality of sensors and the controller.

At 606, the method comprises communicating, in a second frequency range, supply signals from the controller to the plurality of sensors via the two wire communication bus. This communication of the supply signals, for example, can be concurrent to, at about the same time or simultaneously as the communicating of the data communication signals on the bus.

At 608, the method comprises regulating, in a second frequency range, supply voltages of the plurality of sensors based on the supply signals being detected on the two wire communication bus. For example, the regulating, in the second frequency range, can comprise adapting a current signal on the two wire communication bus to one or more sensors of the plurality of sensors via the plurality of current sources based on a detection of a buffer voltage across a buffer capacitor within a sensor feedback loop at the one or more sensors along the bus. The method can also include regulating, via a current source of the controller, a voltage supply signal on the two wire communication bus by detecting a voltage change at a node or across a resistor of a termination device at the controller. The voltage regulation can include increasing, via one or more current sources of one or more sensors, a current at the respective sensor of the in response to a decrease in a voltage being detected at the sensor, and decreasing the current in response to an increase in the detected voltage at the sensor.

At 610, the method comprises matching, in the first frequency range, a load impedance and a line impedance on both sides of the first wire and the second wire of the two wire communication bus.

In another embodiment, the method 400 can further comprise one or more of the acts comprising generating, via at least one current source of the plurality of current sources, a pattern of the plurality of data communication signals comprising only rising signal levels based on increases of a modulation current in the first frequency range for a data transmission; decreasing an average power consumption by generating the pattern of the data communication signals comprising only falling signal levels based on decreases of the modulation current in the first frequency range for the data transmission; generating the pattern of the data communication signals comprising a binary code based on positive and negative amplitudes of a half step; or generating a pattern of the data communication signals comprising a code that comprises symbols from M pulses that have an average value of zero and include at least one edge per symbol, wherein M is greater than or equal to three (e.g., four).

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A sensor bus system, comprising:
   a two wire communication bus, comprising a first wire and a second wire, coupled to a plurality of sensors and a control unit, wherein the two wire communication bus is configured to communicate, in a first frequency range, data communication signals between the plurality of sensors and the control unit, and supply signals from the control unit in a second frequency range that is different than the first frequency range;
   a termination network configured to match a load impedance and a line impedance on both sides of the first wire and the second wire of the two wire communication bus in the first frequency range of the communication signals; and
   a plurality of current sources, respectively corresponding to the plurality of sensors, configured to generate the data communication signals in the first frequency range, and regulate voltages detected at the plurality of sensors in the second frequency range.

2. The sensor bus system of claim 1, wherein the control unit comprises a current source configured to regulate, in the second frequency range, a voltage supply signal on the two wire communication bus via a feedback loop.

3. The sensor bus system of claim 1, wherein the plurality of current sources is further configured to regulate the voltages independently from one another by increasing a current at a sensor of the plurality of sensors in response to a decrease in a voltage and decreasing the current in response to an increase in the voltage.

4. The sensor bus system of claim 1, wherein the plurality of sensors comprise up to n sensors in number connected to the two wire communication bus and the load impedance of at least one sensor of the plurality of sensors is N times greater than the line impedance, wherein N is greater than one and N/n is smaller than 1.

5. The sensor bus system of claim 1, wherein the first frequency range comprises corner frequencies of about 1 MHz or greater, and the second frequency range comprises different corner frequencies that are at least about 5 to 10 times lower than the corner frequencies of the first frequency range.

6. The sensor bus system of claim 1, wherein the two wire communication bus comprises a bi-directional communication bus or a half-duplex communication bus, and the termination network is configured to symmetrically match the load impedance and the line impedance on both sides of the first wire and the second wire of the two wire communication bus in the first frequency range of the communication signals.

7. The sensor bus system of claim 1, wherein the termination network is integrated with one of the plurality of sensors, and at least one sensor of the plurality of current sources, respectively corresponding to the plurality of sensors, is configured to separately generate the data communication signals in the first frequency range independently from regulating the voltages being detected at the plurality of sensors in the second frequency range.

8. The sensor bus system of claim 1, wherein the termination network is distributed over the plurality of sensors separately to match the load impedance and the line impedance on both sides of the first wire and the second wire of the two wire communication bus in the first frequency range based on an average termination impedance of the plurality of sensors.

9. The sensor bus system of claim 1, wherein the two wire communication bus is further configured to facilitate a symmetrical data communication rate or a data communication rate that is higher than a Peripheral Sensor Interface 5 (PSI5) protocol or a Distributed System Interface 3 (DSI3) protocol, and further comprises a bi-directional communication bus or a half-duplex communication bus.

10. The sensor bus system of claim 1, wherein the plurality of current sources comprise an N-type metal-oxide-semiconductor (NMOS) transistor or P-type metal-oxide-semiconductor (PMOS) transistor, respectively, configured to change a current at a sensor of the plurality of sensors in response to a voltage change across a capacitor of the sensor.

11. The sensor bus system of claim 1, wherein the plurality of current sources, respectively corresponding to the plurality of sensors, is further configured to generate a pattern of the data communication signals comprising only rising signal levels based on increases of a modulation current in the first frequency range for a data transmission.

12. The sensor bus system of claim 1, wherein the plurality of current sources, respectively corresponding to the plurality of sensors, is further configured to decrease an average power consumption by generating a pattern of the data communication signals comprising only falling signal levels based on decreases of a modulation current in the first frequency range for a data transmission.

13. The sensor bus system of claim 1, wherein the control unit is configured to generate an average current supply to the plurality of sensors, and demodulate the data communication signals from the plurality of sensors based on a voltage drop on a bus voltage node or across a termination resistor of the control unit coupled between the first wire and the second wire.

14. The sensor bus system of claim 1, wherein the plurality of current sources, respectively corresponding to the plurality of sensors, is further configured to increase a data rate of the two wire communication bus with respect to a lower data rate achievable within a PSI5 bus standard or DSI3 bus standard.

15. The sensor bus system of claim 1, wherein the plurality of current sources, respectively corresponding to the plurality of sensors, is configured to generate a pattern of the data communication signals comprising a binary code based on positive and negative amplitudes of a half step.

16. The sensor bus system of claim 1, wherein the plurality of current sources, respectively corresponding to the plurality of sensors, is configured to generate a pattern of the data communication signals comprising a code that comprises symbols from M pulses that have an average value of zero and include at least one edge per symbol, wherein M is greater than or equal to three.

17. The sensor bus system of claim 1, wherein an impedance of one or more current sources of the plurality of current sources is at least five to ten times higher than the line impedance.

18. The sensor bus system of claim 1, wherein the termination network provides a matching accuracy that is within an accuracy range of 0.5 to 2 times the line resistance of the first wire and the second wire, within the first frequency range.

19. A method for a sensor bus comprising:
generating, in a first frequency range, a plurality of data communication signals by a plurality of current sources of a plurality of sensors;
communicating, in the first frequency range, the plurality of data communication signals between the plurality of sensors and a controller via a two wire communication bus comprising a first wire and a second wire connecting the plurality of sensors and the controller;
providing, in a second frequency range, supply signals from the controller to the plurality of sensors via the two wire communication bus;
regulating, in the second frequency range, supply voltages of the plurality of sensors based on the supply signals being detected on the two wire communication bus; and
matching, in the first frequency range, a load impedance and a line impedance on both sides of the first wire and the second wire of the two wire communication bus.

20. The method of claim 19, wherein the regulating, in the second frequency range, comprises adapting a current signal on the two wire communication bus to one or more sensors of the plurality of sensors via the plurality of current sources based on a detection of a buffer voltage across a buffer capacitor within a sensor feedback loop at the one or more sensors respectively.

21. The method of claim 19, further comprising:
regulating, via a current source of the controller, a voltage supply signal on the two wire communication bus by detecting a voltage change at a node or across a resistor of a termination device at the controller.

22. The method of claim 19, further comprising:
increasing, via the plurality of current sources, a current at a sensor of the plurality of sensors in response to a decrease in a voltage at the sensor; and
decreasing the current in response to an increase in the voltage at the sensor.

23. The method of claim 19, further comprising:
generating, via at least one current source of the plurality of current sources, a pattern of the plurality of data communication signals comprising only rising signal levels based on increases of a modulation current in the first frequency range for a data transmission;
decreasing an average power consumption by generating the pattern of the data communication signals comprising only falling signal levels based on decreases of the modulation current in the first frequency range for the data transmission;
generating the pattern of the data communication signals comprising a binary code based on positive and negative amplitudes of a half step; or
generating the pattern of the data communication signals comprising a code that comprises symbols from M pulses that have an average value of zero and include at least one edge per symbol, wherein M is greater than or equal to three.

24. A sensor system, comprising:
a first sensor and a second sensor that are configured to detect one or more physical parameters and provide data communication signals as current modulated signals in a first frequency range on a bus to a control unit, concurrently receive, in a second frequency range, a power signal on the bus from the control unit and regulate, in the second frequency range the power signal based on a voltage detected at a sensor feedback loop; and
a termination network, comprising a first termination device at a sensor side of the bus and a second termination device at a control unit side of the bus, configured to match, in the first frequency range, a load impedance and a line impedance on the sensor side and the control unit side of the bus.

25. The sensor system of claim 24, wherein a plurality of current sources of the first sensor and the second sensor are configured to operate as current sinks, adjust a sensor current in the second frequency range based on a change in the voltage being detected at a buffer capacitor of the sensor feedback loop to further stabilize a voltage supply of the sensor, wherein the first sensor comprises a first current source configured to regulate the sensor current in the second frequency range independently from operation of a second current source of the first sensor that is configured to generate the current modulated signals for the data communication signals.

26. The sensor system of claim 24, wherein the bus comprises a first wire configured as a high side and a second wire configured as a low side, and wherein the first sensor comprises a first additional connection from a first sensor module to the low side to receive the power signal on the low side, and the second sensor comprises a second additional connection from a second sensor module to the high side to concurrently receive the power signal on the high side.

27. The sensor system of claim 26, wherein the first sensor and the second sensor are configured to concurrently transmit and receive the data communication signals via the bus in bi-directional communications, and modulate current signals at a data rate that is greater than a lower data rate of a PSI5 bus standard or a DSI3 bus standard.

28. The sensor system of claim 24, wherein the control unit is configured to detect the data communication signals, via a control loop, based on a voltage drop detected at a node, or a resistor of the second termination device, and regulate a supply voltage on the bus with a current source of the control loop based on a defined value.

* * * * *